(12) United States Patent
Murai

(10) Patent No.: US 8,536,585 B2
(45) Date of Patent: Sep. 17, 2013

(54) SEMICONDUCTOR LIGHT EMITTING DEVICE INCLUDING ANODE AND CATHODE HAVING THE SAME METAL STRUCTURE

(75) Inventor: Akihiko Murai, Kagoshima (JP)

(73) Assignee: Panasonic Corporation, Osaka (JP)

( * ) Notice: Subject to any disclaimer, the term of this patent is extended or adjusted under 35 U.S.C. 154(b) by 229 days.

(21) Appl. No.: 13/125,294

(22) PCT Filed: Oct. 9, 2009

(86) PCT No.: PCT/JP2009/067957
§ 371 (c)(1),
(2), (4) Date: Apr. 20, 2011

(87) PCT Pub. No.: WO2010/047289
PCT Pub. Date: Apr. 29, 2010

(65) Prior Publication Data
US 2011/0198668 A1    Aug. 18, 2011

(30) Foreign Application Priority Data
Oct. 22, 2008    (JP) .................................. 2008-272329

(51) Int. Cl.
*H01L 27/15*    (2006.01)
(52) U.S. Cl.
USPC .................. 257/81; 257/13; 257/79; 257/103; 257/43
(58) Field of Classification Search
USPC .................................................... 257/43, 79
See application file for complete search history.

(56) References Cited

U.S. PATENT DOCUMENTS 6,577,006 B1 *    6/2003    Oota et al. .................... 257/745
8,231,726 B2    7/2012    Minemoto et al.

(Continued)

FOREIGN PATENT DOCUMENTS

| JP | 2000-252230 A | 9/2000 |
| JP | 2004-128106 A | 4/2004 |
| JP | 2004-179347 A | 6/2004 |

(Continued)

OTHER PUBLICATIONS

International Search Report for the Application No. PCT/JP2009/067957 mailed Nov. 24, 2009.

*Primary Examiner* — Eva Yan Montalvo
(74) *Attorney, Agent, or Firm* — McDermott Will & Emery LLP

(57) ABSTRACT

A semi-conductor light emitting device 10 in the present invention comprises an n-type ZnO substrate 3, an emission layer 2, anode 5, and cathode 4. The n-type ZnO substrate 3 has a mounting surface 31 on one of its surfaces. The emission layer 2 is composed of a p-type GaN film 24 and an n-type GaN film 22, and superimposed on the n-type ZnO substrate 3 with the p-type GaN film 24 directly disposed on the mounting surface 31 of the n-type ZnO substrate 3. The anode 5 is disposed directly on the mounting surface 31 of the n-type GaN substrate 3 in an ohmic contact therewith and in a spaced relation from the emission layer. The cathode 4 is disposed on the n-type GaN film 22 in an ohmic contact therewith. The cathode 4 and anode 5 are of the same structure solely composed of a metallic material. The semi-conductor light emitting device in the present invention assures good ohmic contact of both the cathode 4 and the anode 5, and minimizes consumption of metallic materials.

3 Claims, 3 Drawing Sheets

(56) References Cited

U.S. PATENT DOCUMENTS

2007/0290203 A1* 12/2007 Saeki .......................... 257/43
2008/0237569 A1 10/2008 Nago et al.
2010/0230713 A1 9/2010 Minemoto et al.

FOREIGN PATENT DOCUMENTS

| | | |
|---|---|---|
| JP | 2007-19526 A | 1/2007 |
| JP | 2008-243904 A | 10/2008 |
| WO | WO-2006/138626 A2 | 12/2006 |

* cited by examiner

SEMICONDUCTOR LIGHT EMITTING
DEVICE INCLUDING ANODE AND
CATHODE HAVING THE SAME METAL
STRUCTURE

TECHNICAL FIELD

This invention relates to a semi-conductor light emitting device.

BACKGROUND ART

Many studies have been carried out to develop a semi-conductor light emitting device having an LED chip with its light emitting portion made of nitride semi-conductor material such as GaN, InGaN, AlGaInN, for achieving its high light extraction efficiency and high light output. Many studies have been made to develop a light emitting apparatus which radiates mixed-color light by mixture of luminescent light of the semi-conductor light emitting device and light of phosphor as wavelength transforming material which emits light having its wavelength longer than that of luminescent light of the semi-conductor light emitting device. For example, a white colored light emitting device (generally referred to as a white LED) is commercially available for achieving white colored light by mixture of luminescent lights of phosphor and blue or purple colored light of semi-conductor light emitting device.

FIG. 3 shows an example of semi-conductor light emitting device including a sapphire substrate 1', a cathode 4', an anode 5', and a light emission layer 2' formed of a laminate composed of a buffer layer 121, an n-type GaN layer 122, a light emitting layer 123, and a p-type GaN layer 124. The cathode is provided on the n-type GaN layer 122 at its one surface away from the sapphire substrate 1'. The anode 5' is formed on the p-type GaN 124. Various laminate structures of the light emission layer 2' have been proposed.

The semi-conductor light emitting device in FIG. 3 is configured to emit a light by recombination of electron-hole pairs in the light emitting layer 123 in the presence of forward biased voltage applied between the anode 5' and the cathode 4'. In this semi-conductor light emitting device in FIG. 3, one surface of the sapphire substrate 1' serves as a light output surface by flip-flip mounting to radiate therethrough a light which is emitted from the light emitting layer 123.

The semi-conductor light emitting device in FIG. 3 has the anode 5' and the cathode 4' which are respectively formed of laminates having different electrode structures, due to different electrical characteristic between the p-type GaN 124 and n-type GaN 122 layers. Namely, the electrode suitable for forming the p-type GaN layer 124 is not good ohmic contact (not ohmic contact with low contact resistance) with the n-type GaN layer 122, and the electrode suitable for forming the n-type GaN layer 122 is not good ohmic contact (not ohmic contact with low contact resistance) with the p-type GaN layer 124. In the semi-conductor light emitting device in FIG. 3, the anode 5' is formed of laminate of Ni film 151, Au film 152, and Al film 153, while the cathode 4' is formed of Ti film 141 and Al film 142 superimposed on the Ti film 141. Various electrode structures have been proposed, such as Ni/Au, Pd/Ag, Pt/Au film laminates for both of the anode 5' and the cathode 4', Ti/Al/Ni/Au film laminate for the cathode 4'.

In producing the semi-conductor light emitting device in FIG. 3, the cathode 4' and the anode 5' need to be individually prepared by use of electronic beam deposition method, increasing consumption of metallic material, such as base metal (e.g., Al), novel metal (e.g., Au, Ag, and Pt), and rare metal (e.g., Ti, Ni, and Pd) as well as steps of producing, thereby rising the manufacturing cost.

JP Unexamined patent publication 2004-179347 discloses that both cathode and anode are formed of laminates composed of ITO and Ag films.

However, in the semi-conductor light emitting device of JP Unexamined patent publication 2004-179347, Ag film can be detached from ITO film of laminate for lack of adhesion between ITO and Ag films, during or after flip-flop mounting.

Moreover, the semi-conductor light emitting device in JP Unexamined patent publication 2004-179347 fails to achieve high light output, for large amount of light totally reflected at an interface between the LED layer 2' and the sapphire substrate 1' due to a large gap in refractive index therebetween.

DISCLOSURE OF THE INVENTION

A semi-conductor light emitting device in the present invention has been accomplished in view of the above problem. The present invention is intended to improve reliability of a cathode and an anode, minimize consumption of metallic material, and achieve high light output of the semi-conductor light emitting device.

The semi-conductor light emitting device in the present invention comprises an n-type ZnO substrate, a light emission layer, the anode, and the cathode. The n-type ZnO substrate has a mounting surface on one of its surfaces. The light emission layer is composed of a p-type GaN film and an n-type GaN film superimposed on the p-type GaN film. The light emission layer is superimposed on the n-type ZnO substrate with the p-type GaN film directly disposed on the mounting surface of the n-type ZnO substrate. The anode is disposed directly on the mounting surface of the n-type ZnO substrate in an ohmic contact therewith and in a spaced relation from the emission layer. The cathode is disposed on the n-type GaN film in an ohmic contact therewith. The anode and cathode are of the same structure solely composed of a metallic material.

The semi-conductor light emitting device in the present invention assures good ohmic contact of both the anode and the cathode, and enables to minimize consumption of metallic materials. The semi-conductor light emitting device in the present invention is enabled to improve adhesion between layers of laminate of both electrodes, achieving its high reliability. Besides, the p-type GaN layer of the light emission layer is formed on the transparent n-type ZnO substrate having its refractive index smaller than that of the sapphire substrate, improving light extraction efficiency, thereby achieving high light output.

It is preferable that each of the cathode and the anode is made of a metal laminate composed of a first metal film and a second metal film. The first metal film of the anode is held in direct ohmic contact with the n-type ZnO substrate. The first metal film of the cathode is held in direct ohmic contact with the n-type GaN film of the light emission layer. In this configuration, each of the cathode and anode is made of metal, improving adhesion between layers of its laminate.

It is preferable that the metal laminate is selected from a group consisting of a laminate composed of a Ti film, an Au film, and an Al film interposed therebetween, a laminate composed of a Ti film and an Au film, a laminate composed of an Al film and an Au film, a laminate composed of a Ti film, an Al film, a Ni film, and an Au film. Each of the cathode and the anode in this semi-conductor light emitting device, the Au film is respectively disposed to be the lowest film in the metal laminate, thereby reliably connected to the Au bump in flip-flop mounting and prevented from being oxidized.

Figure 1:
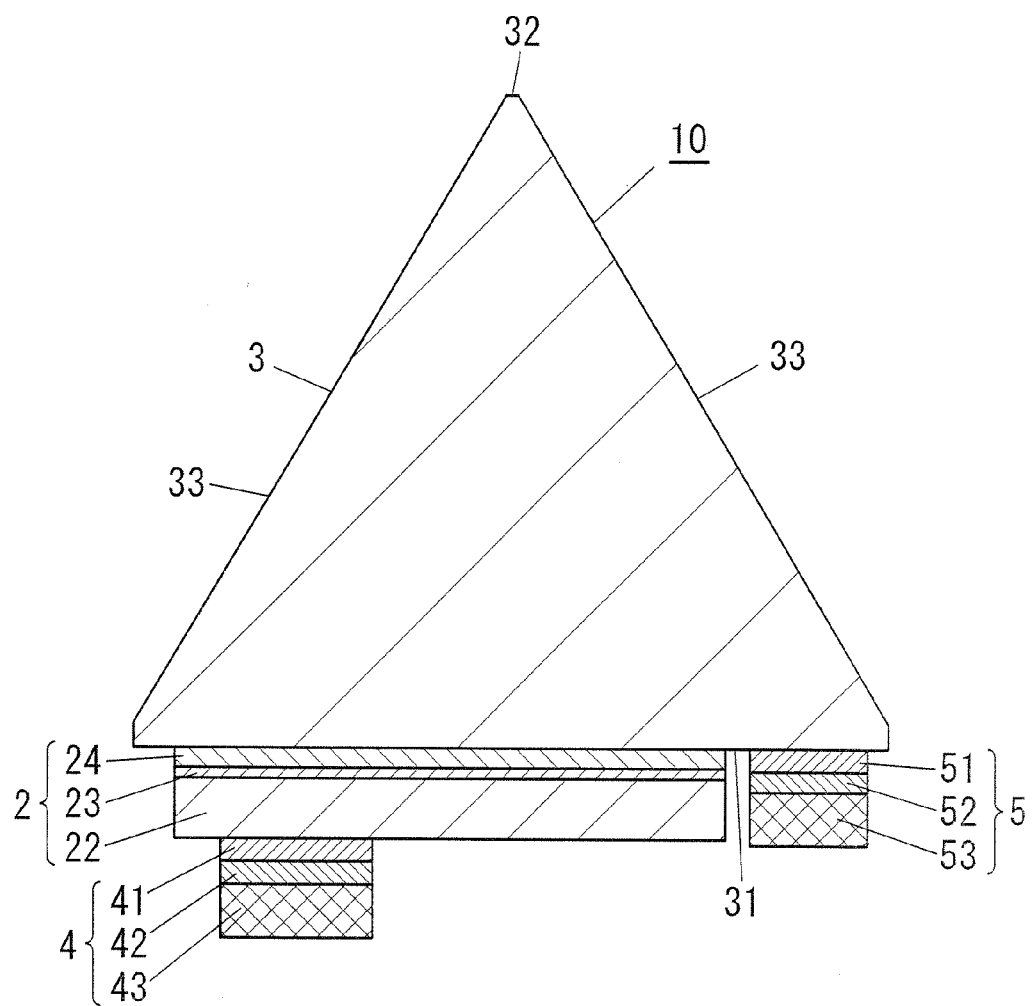
FIG. 1 shows a schematic sectional view of a semi-conductor light emitting device in accordance with first embodiment.

BEST MODE FOR CARRYING OUT THE INVENTION (First Embodiment)

Hereafter, explanations are made as to a semi-conductor light emitting device 10 in this embodiment.

The semi-conductor light emitting device 10 in this embodiment comprises an n-type ZnO substrate 3, a light emission layer 2, a cathode 4. and an anode 5. The n-type ZnO substrate 3 has a mounting surface 31 on one of its surfaces. The light emission layer 2 is formed of a GaN-based blue light LED chip composed of an n-type GaN film 22, a light emitting film 23, and a p-type GaN film 24. The mounting surface 31 of the n-type ZnO substrate 3 is larger than plane size of the p-type GaN film 24. The p-type GaN film 24 is directly disposed on the mounting surface 31 of the n-type ZnO substrate 3, and superimposed thereon with the light emitting film 23. The n-type GaN film 22 is formed on the light emitting film 23 away from the p-type GaN film 24. The anode 5 is disposed directly on the mounting surface 31 of the n-type ZnO substrate 3 in an ohmic contact therewith and in a spaced relation from the light emission layer 2. The cathode 4 is disposed on the n-type GaN film 22 in an ohmic contact therewith. The cathode 4 and the anode 5 are of the same structure solely composed of a metallic material.

In the semi-conductor light emitting device 10, the light emission layer 2 is composed of the n-type GaN film 22, light emitting film 23, and the p-type GaN film 24. The light emission layer 2 is smaller in plane size than the mounting surface 31 of the n-type ZnO substrate 3. The cathode 4 is superimposed on the n-type GaN film 22 at the center of its surface in opposite relation with the light emitting film 23 from the n-type GaN film 22. The anode 5 is formed on the mounting surface 31 in a spaced relation from the light emission layer 2. With this configuration of the semi-conductor light emitting device 10, the n-type GaN film 22, the light emitting film 23, and the p-type GaN film 24 are arranged to have same plane size. The shape, size, number, and position of cathode 4 formed on the n-type GaN film 22 are not limited. Before superimposed on an n-type ZnO wafer which serves as a source of the n-type ZnO substrate 3, the light emission layer 2 is formed on one (0001) surface of a sapphire wafer by an epitaxial growth technique such as MOVPE (Metal Organic Vapour Phase Epitaxy), as described below. The epitaxial growth technique of the light emission layer 2 is not limited to the MOVPE, but may be HVPE (Hydride Vapor Phase Epitaxy), MBE (Molecular beam epitaxy), or the like.

The light emitting film 23 has a quantum well structure having a plurality of GaN-based barriers and an InGaN-based well interposed between the GaN-based barriers. The light emitting film 23 is not limited to the single quantum well structure, but may be a multi quantum well structure. The light emitting film 23 is not limited to the quantum well, but may be formed of a single layer. The light emitting film 23 in this embodiment is set to have a specific composition of InGaN so as to emit a light having its peak wavelength of 450 nm. This invention is not limited to the peak wavelength. The light emitting film 23 needs to be made of a nitride semi-conductor material, and may be formed of one material selected from AlInGaN, AlInN, AlGaN, and the like, so as to give a desired peak wavelength.

The metal laminate of the light emission layer 2 is essentially composed of the n-type GaN film 22 and the p-type GaN film 24. Namely, the light emission layer 2 may be a metal laminate only composed of the n-type GaN film 22 and the p-type GaN film 24, a metal laminate composed of the light emitting film 23, the p-type GaN film 24, and a p-type AlGaN film interposed therebetween, or the like.

Both GaN and ZnO are polar semi-conductor material having Wurtzite typed crystal structure, and are polarized along c-axis. In the light emission layer 2, the n-type GaN film 22 has an N-polarized (000-1) surface at one of its surfaces in opposite relation with the light emitting film 23. The p-type GaN film 24 has a Ga-polarized (0001) surface at one of its surfaces in opposite relation with the light emitting film 23. The n-type ZnO substrate 3 has a Zn-polarized (0001) surface at its mounting surface 31, and an O-polarized (000-1) surface at its top surface 32 opposite of the mounting surface 31. Namely, the light emission layer 2 is superimposed on the n-type ZnO substrate 3 such that the Zn-polarized surface of the ZnO substrate 3 comes in contact with the Ga-polarized surface of the p-type GaN film 24.

In the semi-conductor light emitting device 10 in this embodiment, the n-type ZnO substrate 3 is substantially shaped into a truncated hexagonal pyramid which has its bottom surface serving as the mounting surface 31 adjacent to the light emission layer 2 and its top surface 32 away from the light emission layer 2. The light emission layer 2 is substantially formed into hexagonal shape smaller in plane size than the mounting surface 31. The n-type ZnO substrate 3 having n-type conductivity may be achieved by utilizing defect in O or Zn atom of ZnO crystal lattice, except doping. But, the ZnO substrate 3 is suited to be controlled to have its specific n-type conductivity by use of a doped ZnO substrate such as a Ga-doped ZnO substrate (GZO substrate), an Al-doped ZnO substrate (AZO substrate), or the like, for the purpose of decreasing the ohmic contact resistance with the anode 5.

The anode 5 is formed of a laminate composed of Ti film 41 as a first film, Al film 42 as a second film, Au film 43 as a third film, and the cathode 4 is formed of a laminate composed of Ti film 51 as a first film, Al film 52 as a second film, Au film 53 as a third film. Ti film 41 of the cathode and Ti film 51 of the anode are respectively disposed directly on the n-type GaN film 22 of the light emission layer 2 and the n-type ZnO substrate 3. In each of the anode and cathode, the Al film 42,52 is directly disposed on the Ti film 41,51, and the Au film 43,53 is superimposed on the Al film 42,52 away from Ti film 41,51. Namely, the Au film 43,53 is disposed to be the lowest film in the metal laminate of each electrode. In each electrode, the Ti-film 41,51, the Al-film 42,52, and the Au-film 43,53 are set to have their thickness of 10 nm, 50 nm, and 500 nm, respectively. The invention is not limited to the thicknesses. In the semiconductor light emitting device 10 in this embodiment, both the cathode 4 and the anode 5 have the same electrode structure composed of same metallic materials, enabling to achieve high adhesion at an interface between the adjacent films of metal laminate, an interface between the cathode 4 and the n-type GaN film 22, and an interface between the anode 5 and the n-type ZnO substrate 3. In this embodiment, the cathode 4 and the anode 5 are formed at the same time by electron beam deposition (EB deposition).

In the semi-conductor light emitting device 10 in this embodiment, each of the cathode 4 and the anode 5 is formed of the metal laminate which is composed of Ti film 41,51, Al film 42,52, and Au film 43,53, to be held in superior ohmic contact (ohmic contact with low contact resistance) with the n-type GaN film 22 and the n-type ZnO substrate 3, respectively. Each of the electrodes may be formed of a metal laminate composed of a Ti film and an Au film, a metal laminate composed of a Al film and an Au film, or a metal laminate composed of a Ti film, an Al film, a Ni film, and an Au film. In any of the above metal laminates, the Au film is disposed to be the lowest film in the metal laminate of each electrode, preventing oxidation of the cathode 4 and the anode 5, and improving reliability for being connected to Au bump during flip-flop mounting.

When receiving a forward biased voltage which is applied between the anode 5 and the cathode 4, the semi-conductor light emitting device 10 in this embodiment is driven to generate tunneling current such that electrons flow into the n-type GaN film 22 from the cathode 4, and holes flow into the p-type GaN film 24 from the anode 5, then recombining the electrons and holes in the light emitting film 23, thereby emitting a light to be radiated through the lateral surfaces 33 and the top surface 32 of the n-type ZnO substrate 3. ZnO, GaN, and the air respectively have their refractive index of 2.1, 2.4, and 1, in response to light having its peak wavelength of 450 nm.

Hereafter, explanations are given as to a method of manufacturing the semi-conductor light emitting device 10.

First, the sapphire wafer is formed at its one (0001) surface with the light emission layer 2 of the metal laminate composed of the n-type GaN film 22, the light emitting film 23, and the p-type GaN film 24 by MOVPE, or the like, with a buffer layer made of undoped GaN film being interposed between the sapphire wafer and the light emission layer 2. (Crystal growth process) Then, the light emission layer 2 is patterned into a substantially hexagonal shape by use of photolithographic and etching techniques. (Patterning process) Next, the light emission layer 2 is superimposed on the n-type ZnO wafer serving as source of the n-type ZnO substrate 3. (Superimposing process) Next, the n-type ZnO wafer is provided at its one surface away from the light emission layer 2 with the masking layer patterned into its predetermined shape (Masking process), and then the sapphire wafer is removed from the light emission layer (Wafer-lift-off process). After formation of the cathode 4 and the anode 5 (Electrode formation process), the n-type ZnO wafer is etched to form the n-type ZnO substrate 3 shaped into truncated hexagonal pyramid, by utilizing anisotropic etching rate in relation to its crystallographic orientation, with the use of etching acidic solution such as hydrochloric acid. (n-type ZnO substrate formation process) Then, the masking layer is removed from the n-type ZnO substrate. (Mask layer removal process) The n-type ZnO wafer in this embodiment has its dislocation defect density of $10^3$ cm$^{-2}$ or less than, and is produced by hydrothermal synthesis suited to its mass-production. The superimposing process in this embodiment is performed by a first step of cleaning the n-type ZnO wafer and one surface of light emission layer 2 to be in contact with the n-type ZnO wafer, a second step of superimposing the n-type ZnO wafer on the light emission layer 2 at its one surface in opposite relation with the sapphire wafer from light emission layer 2, and a third step of connecting the n-type ZnO wafer to the light emission layer 2 by applying predetermined pressure (e.g., 2 MPa) under thermal treatment. This invention is not limited to the pressure. The applied pressure can be determined in accordance with a size of the n-type ZnO wafer. The thermal treatment in this embodiment is performed at a temperature of 800° C. in nitrogen gas. This invention is not limited to the temperature. The electrode formation process needs to be performed by a first step of providing the mounting surface of the n-type ZnO substrate 3 with a resist layer having an opening at specific portions corresponding to the cathode and the anode by the photolithographic technique, a second step of forming the cathode 4 and the anode 5 at the same time by the electron beam deposition, and a third step of removing (lifting off) the resist layer and unwanted films with an organic solvent (e.g., acetone).

The n-type ZnO substrate 3 is shaped into the truncated hexagonal pyramid, and arranged to have its predetermined thickness by selection of thickness of n-type ZnO wafer. In this embodiment, the n-type ZnO wafer is selected to have its thickness of 500 μm, giving the n-type ZnO substrate with its thickness of 500 μm. This invention is not limited to the thickness of the n-type ZnO wafer. Each of lateral surfaces 33 of the n-type ZnO substrate 3 is controlled to have a specific inclination angle in relation to the mounting surface 31, in accordance with crystal axis of the n-type ZnO wafer. In this embodiment, the n-type ZnO wafer has its Zn-polarized (0001) surface to serve as the mounting surface 31, its O-polarized (000-1) surface to serve as the top surface 32, and is etched by the crystalline anisotropic etching so as to form the n-type ZnO substrate 3. Such etching process enables to arrange the lateral surfaces 33 to be {10-1-1} surface, thereby allowing the lateral surfaces 33 to reproducibly have their inclination angle of 60 degrees. Moreover, in this embodiment, the crystalline anisotropic etching of the n-type ZnO wafer is implemented with the use of hexagonal masking layer, enabling to define both of an area of top surface 32 of the n-type ZnO substrate by regulation of plane size of the masking layer, and an area of the mounting surface 31 of the n-type ZnO substrate 3 by regulation of plane size of the masking layer and thickness of the n-type ZnO wafer. Therefore, the mounting surface 31 of the n-type ZnO substrate 3 is allowed to have its large area by regulation of plane size of the masking layer, thereby enabling to achieve high light output with use of a large sized light emission film 23.

Figure 3:
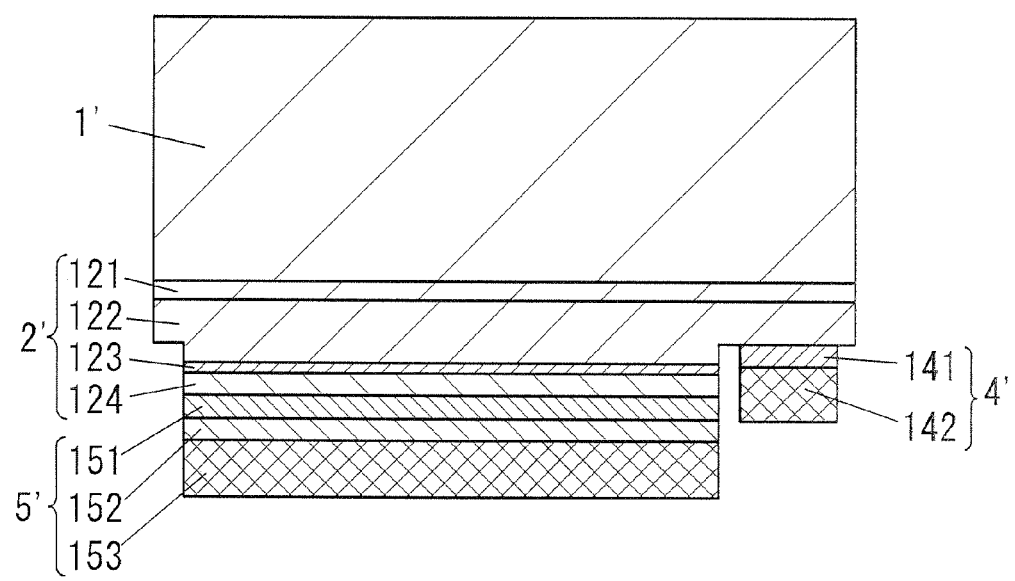
FIG. 3 shows a schematic sectional view of a conventional semi-conductor light emitting device.

In the semi-conductor light emitting device 10 of this embodiment, the cathode 4 and the anode 5 are respectively provided on the n-type GaN film 22 and the ZnO substrate 3, and formed of metal laminates which are composed of the same metallic material. It enables to minimize consumption of metallic material in forming the electrodes and to achieve superior ohmic contact for both of the cathode and the anode as well as increasing adhesion, thereby improving its reliability. The p-type GaN film 24 of the light emission layer 2 has its refractive index smaller than that of the sapphire substrate 1' (see FIG. 3), and is superimposed on the transparent n-type ZnO substrate 3, improving light extraction efficiency, thereby achieving high light output. In this embodiment, the Ti film 41 and 51 in each of the cathode 4 and the anode 5 is disposed to be the uppermost film in the metal laminate, thereby improving adhesion at the interface between the cathode 4 and the n-type GaN film 22 and the interface between the anode 5 and the n-type ZnO substrate 3.

In the semi-conductor light emitting device 10 in this embodiment, the n-type ZnO substrate 3 is composed of abundant and nontoxic atoms Zn and O, thereby deemed suitable to be stably produced at a low cost. Moreover, each of the lateral surfaces 33 is set to have its inclination angle of 60 degrees in relation to the mounting surface 31 mounting the cathode 4 and the anode 5, thereby increasing spread angle of radiated light. The semi-conductor light emitting device 10 of the present embodiment gives a radiant intensity of 50% or more within an output angle of 120° or more.

(Second Embodiment)

Figure 2:
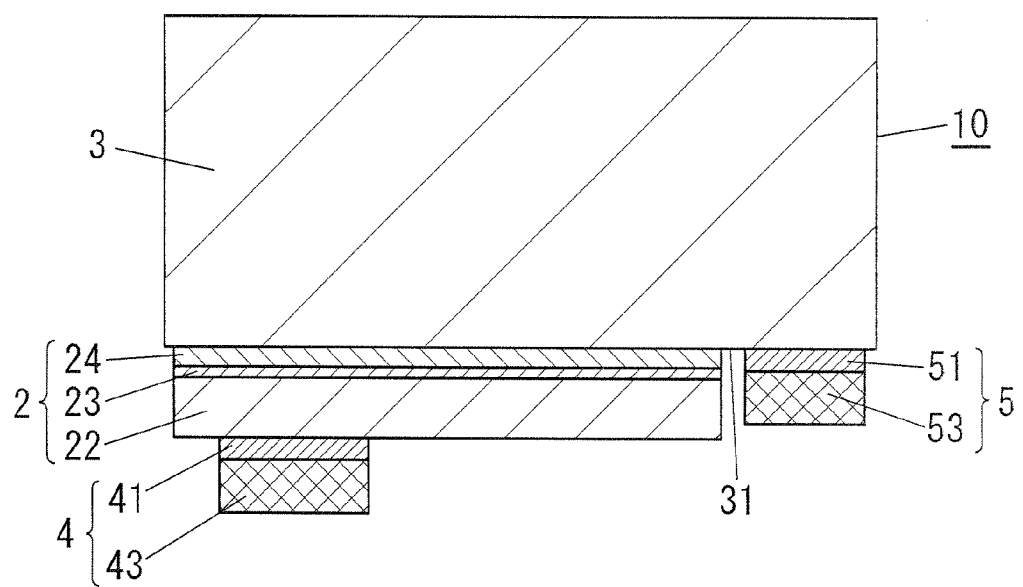
FIG. 2 shows a schematic sectional view of a semi-conductor light emitting device in accordance with second embodiment.

The semi-conductor light emitting device 10 in this embodiment in FIG. 2 has a basic structure similar to the first embodiment. In the semi-conductor light emitting device 10 of this embodiment, the n-type ZnO substrate 3 is shaped into rectangular, and each of the cathode 4 and the anode 5 is made of metal laminate composed of Ti film 41,51 as a first film and Au film 43,53 as a second film. Like components as that of the first embodiment are designated by like numerals, and no duplicate explanation is deemed necessary.

In this embodiment, Ti film 41,51 and Au film 43,53 are respectively set to have their thickness of 10 nm and 50 nm, but the invention is not limited to the thicknesses. Each of the electrodes may be formed of a metal laminate composed of Ti film 41,51, Al film 42,52, and Au film 43,53, as employed in the first embodiment shown in FIG. 1, Each of the electrodes may be a metal laminate composed of Ti film and Au film, or a metal laminate composed of Ti film, Al film, Ni film, and Au film which are superimposed in this order.

The manufacture process of the semi-conductor light emitting device 10 in this embodiment is nearly identical to that in the first embodiment. In this embodiment, the light emission layer 2 is formed into rectangular shape in the patterning process, subsequent to the crystal growth process. In the superimposing process, the light emission layer 2 is superimposed on the n-type ZnO wafer serving as source of the n-type ZnO substrate 3. After the wafer-lift-off process of removing the sapphire substrate and the subsequent electrode formation process of forming the cathode 4 and the anode 5, the n-type ZnO wafer is diced into a rectangular-shaped n-type ZnO substrate 3.

In the semi-conductor light emitting device 10 of the above embodiments, the light emitting film 23 is designed to emit blue color light. However, the color of emitted light is not limited to blue, but may be red, green, or purple. The semi-conductor light emitting device 10 may be combined with a fluorescent material (or a wavelength-conversion material) which is excited by a light of the light emitting device 10 and emits a light of color having its wavelength longer than that of luminescent light of the light emitting device 10, so as to form a light emitting apparatus to radiate mixed color light (e.g., white color light) of a color different from a luminescent color of the light emitting device 10.

The invention claimed is:

1. A semi-conductor light emitting device comprising:
an n-type ZnO substrate having a mounting surface;
a light emission layer composed of a p-type GaN film and an n-type GaN film superimposed on said p-type GaN film, said light emission layer being superimposed on said n-type ZnO substrate with said p-type GaN film directly disposed on said mounting surface of said n-type ZnO substrate;
an anode disposed directly on said mounting surface of said n-type ZnO substrate in an ohmic contact therewith and in a spaced relation from said light emission layer; and
a cathode disposed on said n-type GaN film in an ohmic contact therewith, wherein:
said anode and said cathode are of the same structure solely composed of a metallic material,
each of said anode and said cathode is made of a metal laminate, and
said anode is disposed directly on said mounting surface, and said cathode is disposed on said mounting surface through said light emission layer such that said p-type GaN film of said light emission layer is disposed directly on said mounting surface.

2. The semiconductor light emitting device as set forth in claim 1, wherein:
each of said cathode and said anode is made of a metal laminate composed of a first metal film and a second metal film,
said first metal film of said anode forms direct ohmic contact with said n-type ZnO substrate, and
said first metal film of said cathode forms direct ohmic contact with said n-type GaN film of the light emission layer.

3. The semiconductor light emitting device as set forth in claim 1, wherein:
said metal laminate is selected from a group consisting of:
a laminate composed of a Ti film, an Au film, and an Al film interposed therebetween;
a laminate composed of a Ti film and an Au film;
a laminate composed of an Al film and an Au film; and
a laminate composed of a Ti film, an Al film, a Ni film, and an Au film laminated in this order.

* * * * *